(12) United States Patent
Datta et al.

(10) Patent No.: US 7,559,046 B1
(45) Date of Patent: *Jul. 7, 2009

(54) CIRCUIT DESIGN TOOLS WITH OPTIMIZATION ASSISTANCE

(75) Inventors: Subroto Datta, Fremont, CA (US); Michael Wenzler, Oakland, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/963,591

(22) Filed: Dec. 21, 2007

Related U.S. Application Data

(63) Continuation of application No. 10/993,947, filed on Nov. 18, 2004, now Pat. No. 7,328,420.

(51) Int. Cl.
*G06F 17/50* (2006.01)
(52) U.S. Cl. ........................................... 716/11
(58) Field of Classification Search ............... 716/11
See application file for complete search history.

(56) References Cited

U.S. PATENT DOCUMENTS

| | | | |
|---|---|---|---|
| 5,572,717 A | 11/1996 | Pedersen | |
| 5,623,418 A * | 4/1997 | Rostoker et al. | 716/1 |
| 5,896,301 A * | 4/1999 | Barrientos | 716/8 |
| 6,161,211 A | 12/2000 | Southgate | |
| 6,311,309 B1 | 10/2001 | Southgate | |
| 6,477,683 B1 * | 11/2002 | Killian et al. | 716/1 |
| 6,588,004 B1 | 7/2003 | Southgate et al. | |
| 6,697,773 B1 | 2/2004 | Karchmer et al. | |
| 6,763,506 B1 | 7/2004 | Betz et al. | |
| 2003/0023339 A1 * | 1/2003 | Moriya et al. | 700/121 |

* cited by examiner

*Primary Examiner*—Jack Chiang
*Assistant Examiner*—Brandon W Bowers
(74) *Attorney, Agent, or Firm*—Treyz Law Group; G. Victor Treyz

(57) ABSTRACT

Computer aided design tools are provided that assist circuit designers in optimizing circuit performance. A circuit designer who is designing an integrated circuit may supply circuit design data and constraint data. Computer aided design tools may process the data to produce output data. The output data may include information on an implementation of the circuit design in a given type of integrated circuit device and may include report data on how the implementation of the circuit design is expected to perform. An optimization assistance tool analyzes the design and constraint data and the report data to identify potential problem areas. Recommendations may be provided to the circuit designer on how to address potential problems. Selectable options are displayed for the circuit designer. By selecting an appropriate option, the circuit designer can automatically launch a tool to make recommended settings adjustments.

13 Claims, 14 Drawing Sheets

CIRCUIT DESIGN TOOLS WITH OPTIMIZATION ASSISTANCE

This application is a continuation of patent application Ser. No. 10/993,947, filed Nov. 18, 2004, now U.S. Pat. No. 7,328,420 which is hereby incorporated by reference herein in its entirety.

BACKGROUND OF THE INVENTION

This invention relates to circuit design, and more particularly, to circuit design tools with optimization assistance capabilities.

Complex integrated circuit designs are typically created using computer aided design (CAD) tools. For example, logic designers that are designing custom logic circuits for programmable logic devices (PLDs), use PLD design tools to help create their designs. Designers of application specific integrated circuits (ASICs) and other integrated circuits also use tools during the design process.

After a circuit designer has input a desired circuit design and has provided the CAD tools with constraints for the design such as acceptable timing performance criteria, the circuit designer uses the CAD tools to generate an output in a desired format. The CAD tools may, for example, use the specified design to generate configuration data for a programmable logic device. The configuration data can be loaded into the programmable logic device to create a custom logic circuit implementation of the circuit design. As another example, the CAD tools may use the specified design to generate mask layout data. The mask layout data may be used to produce a mask set with which to fabricate a chip containing the desired circuit design.

The performance of a given implementation of a circuit design depends on a number of factors. CAD tools are available that assist circuit designers in identifying potential problems. For example, programmable logic device CAD tools are available that can generate a report on each implementation of a given design. The report may contain information on timing performance, resource consumption, etc. A circuit designer can use the information in these reports to evaluate whether or not a particular design is performing satisfactorily.

If information in a report indicates that the circuit is not meeting the designer's goals, the circuit designer must attempt to reformulate the circuit design or change the constraints associated with the design. Often the designer is not certain how to make improvements, so the designer consults online help services or attempts to obtain assistance from a vendor's telephone help desk. Through online searching and conversations with help desk personnel, the circuit designer may obtain information on which CAD tool settings should be modified to improve the design. The designer then runs various CAD tools and attempts to adjust the correct settings. It may often take hours or days to make improvements, due to the large number of variables involved.

It would be desirable if there were improved ways to use CAD tools to optimize a circuit design.

SUMMARY OF THE INVENTION

In accordance with the present invention, computer aided design tools are provided that help a circuit designer that is working on implementing a given circuit design in an integrated circuit. The circuit designer can use the computer aided design tools to input a design. The designer can specify various constraints. For example, the designer can use the computer aided design tools to input timing constraints and constraints related to the consumption of circuit resources, noise levels, temperature profiles, or other suitable constraints.

The computer aided design tools can process the circuit designer's design to develop a proposed implementation of the design that meets the designer's constraints. The tools can output both data for the implemented circuit design and report data.

An optimization assistance tool may analyze the data supplied by the circuit designer and the output from the computer aided design tools to determine potential problems. For example, if the proposed implementation of the circuit design is slow, the proposed implementation may not reliably meet the circuit designer's specified timing constraints. The optimization assistance tool may therefore present the circuit designer with recommendations (e.g., to loosen constraints related to resource consumption and thereby improve timing performance).

The optimization assistance tool may display selectable options for various potential problems. If the circuit designer clicks on one of these selectable options, the optimization assistance tool may provide the circuit designer with detailed recommendations related to addressing a problem with the design and constraints. The optimization assistance tool may also display links to online help sites.

A "get detail" option may be displayed for the circuit designer. When the designer clicks on the get detail option, the optimization assistance tool gathers additional information on the potential problem that is specific to the current design. For example, the optimization assistance tool may gather and display information on certain circuit node placement constraints (assignments) or other design object settings for the current design that should be adjusted to optimize performance.

One or more selectable options may be displayed for the circuit designer that automatically launch a computer aided design tool that can be used to make settings adjustments to address the problems identified by the optimization assistance tool. For example, on a page of recommendations associated with changing programmable logic device placement constraints (also sometimes called placement assignments), the optimization assistance tool can display a clickable link to a programmable logic device constraint editor tool. If the circuit designer clicks on this link, the optimization assistance tool can automatically launch the constraint editor. The circuit designer can use the constraint editor to make recommended adjustments to placement constraints. The circuit designer can then compile the design using the updated placement constraints to determine whether the recommended changes to the placement constraint settings had their intended effect in improving performance. The optimization assistance tool may also be used to automatically launch a design editor that the circuit designer can use to make changes to the design data for the circuit design.

Further features of the invention, its nature and various advantages will be more apparent from the accompanying drawings and the following detailed description of the preferred embodiments.

DETAILED DESCRIPTION OF THE PREFERRED EMBODIMENTS

The present invention relates to computer aided design tools and ways to use computer aided design tools in designing integrated circuits. The computer aided design tools may be used to implement a desired logic design in a programmable logic device integrated circuit. With this type of arrangement, the computer aided design tools may produce programming data that is loaded into an unprogrammed programmable logic device to configure the device to perform a custom logic function. The computer aided design tools may also be used to construct a mask set for implementing a given circuit design as an integrated circuit.

The computer aided design tools of the present invention may have optimization assistance capabilities. This allows the computer aided design tools to provide a circuit designer with computer-based assistance in optimizing a particular design. For example, a circuit designer may be provided with recommendations to change certain settings in an appropriate computer aided design tool. The circuit designer may be provided with selectable on-screen options related to changing settings. When the circuit designer selects an option, the appropriate computer aided design tool to be used to make the changes may be launched. Information on which settings are to be changed may be passed to the computer aided design tool so that when the tool is launched the screens that are displayed will contain information on the particular design objects and settings involved in making a recommended settings adjustment.

Figure 1:
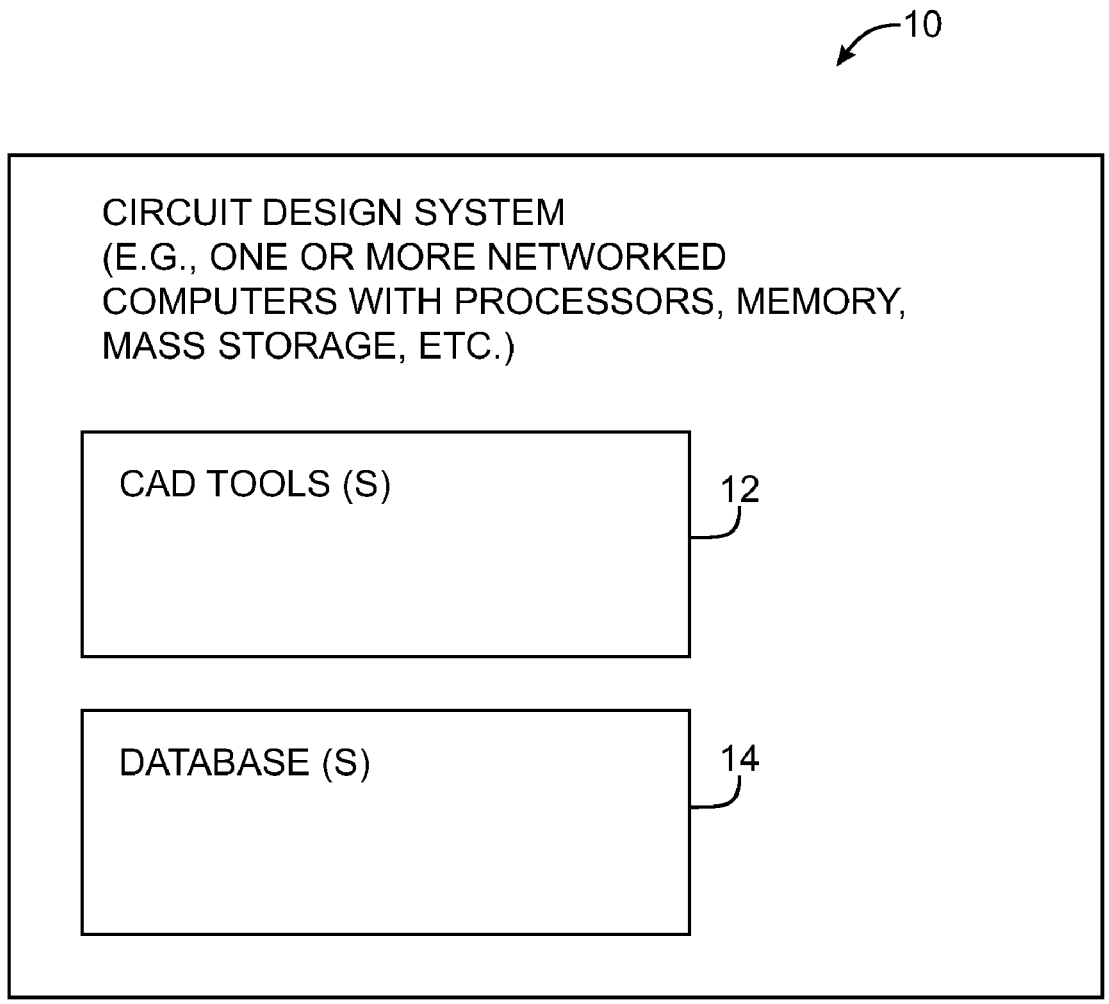
FIG. 1 is a diagram of an illustrative circuit design system in accordance with the present invention.

An illustrative circuit design system 10 in accordance with the present invention is shown in FIG. 1. System 10 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 12 and databases 14 reside on system 10. During operation, executable software such as computer aided design tool(s) 12 runs on the processor(s) of system 10. Databases 14 are used to store data for the operation of system 10. In general, software and data may be stored on any computer-readable medium (storage) in system 10. Such storage may include, for example, computer memory chips, removable and fixed media such as hard disk drives, flash memory, compact discs (CDs), DVDs, other optical media, and floppy diskettes, tapes, or any other suitable memory or storage device(s). When the software of system 10 is installed, the storage of system 10 has instructions and data that cause the computing equipment in system 10 to execute various methods (processes). When performing these processes, the computing equipment is configured to implement the functions of the circuit design system.

The computer aided design tools 12 may be provided by a single vendor or multiple vendors. The tools 12 may be provided as one or more suites of tools (e.g., a compiler suite for performing tasks associated with implementing a circuit design in a programmable logic device) and/or as one or more separate software components (tools). Databases 14 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

Systems such as system 10 may be used to design circuits of various types. For example, system 10 may be used to implement a given circuit design in a programmable logic device integrated circuit. With this type of arrangement, system 10 may be used to generate programming data that is used for mask programming or electrically programming appropriate programmable elements on the programmable logic device integrated circuit. Once programmed, the programmable logic device will perform the custom logic functions needed to implement the circuit design. As another example, system 10 may be used to implement a given circuit design in a custom or semi-custom integrated circuit. With an arrangement of this type, the output from system 10 may be provided in the form of a set of semiconductor fabrication masks that are used to fabricate a silicon chip containing the circuit. The invention will often be described in the context of computer aided design tools for programmable logic device logic design, but this is merely illustrative. Tools 12 and system 10 may be used for any suitable circuit design project if desired.

When a circuit designer uses tools 12 to implement a circuit (either as a soft design on a programmable logic or as a hard design on a custom or semi-custom silicon chip), the circuit designer is faced with a number of potentially challenging design decisions. The circuit designer must balance factors such as cost, size, and performance to create a workable end product. Tradeoffs are involved. For example, a circuit of a given design can be implemented so that it operates quickly, but consumes a large amount of power and on-chip resources or can be implemented so that is operates more slowly, while consuming less power and fewer resources.

The design process itself is subject to tradeoffs. For example, if the circuit designer directs the computer aided design tools to search for an optimal implementation of a particular portion of a circuit, the computer aided design tool may require extra hours or days to perform its design and simulation tasks. The circuit designer can achieve a faster result by changing appropriate settings in the tools, but this will generally result in a circuit implementation with suboptimal performance.

The present invention provides optimization assistance capabilities for system 10. Optimization assistance functionality helps circuit designers make appropriate tradeoffs. Optimization assistance may be provided using hardware and software.

Suitable hardware for supporting optimization assistance functionality may be hardware such as the computing equipment of circuit design system 10 of FIG. 1.

Optimization assistance software may be provided using one or more separate software components and/or software components that are integrated within one or more of the computer aided design tools 12 that are otherwise used to perform the design, analysis, and implementation functions of circuit design system 10.

For clarity, the optimization assistance functions of the invention are generally described in the context of one or more "optimization assistance tools." This is merely illustrative. Any suitable number of software components (e.g., one or more tools) may be used to provide a circuit designer with optimization assistance. The software components may be considered to be separate from logic compilers, place-and-route tools and other software in tools 12 or some or all of the software components that provide optimization assistance functionality may be provided within a logic compiler, place-and-route tool, etc.

Figure 2:
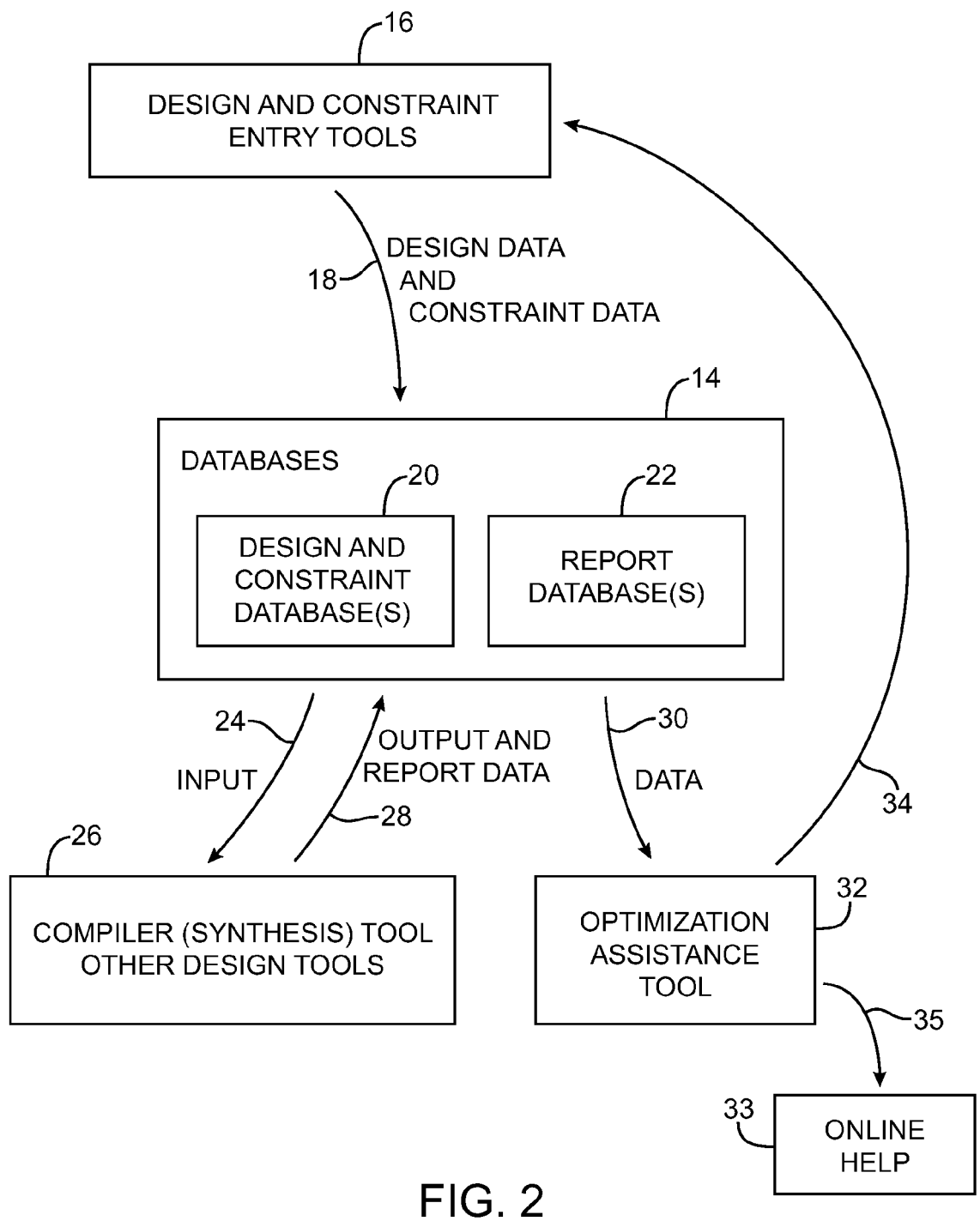
FIG. 2 is a diagram of illustrative software and database components in a computer-implemented circuit design system in accordance with the present invention.

FIG. 2 shows the interrelationship of illustrative software components that may be used to provide circuit design and optimization assistance support.

Design and constraint entry tools 16 may be used to allow a circuit designer to formulate enter a desired circuit design and constraints for that design. Design and constraint entry tools 16 may include a text editor that the circuit designer can use to enter a hardware description language (HDL) description of the desired circuit design. An example of a design and constraint entry tool for entering constraints is a programmable logic device constraint editor. A constraint editor tool may be used to enter constraints for various design objects (design elements). For example, particular circuit nodes in a logic design may be assigned to particular logic regions on a programmable logic device. These constraints serve as additional limitations on the design, because once the constraints have been made, the computer aided design tools 12 are no longer able to place the constrained nodes in any region of the device. Constraining the node locations in this way may help to optimize the device performance, or, if chosen poorly, may make it difficult to optimize performance.

The inputs provided by the circuit designer and other design and constraint data from tools 16 may be stored in databases 14, as shown by arrow 18. Any suitable format and/or data structures may be used for databases 14. For example, data may be stored in one or more files, groups of files, etc. Databases 14 may include a design and constraint database 20 for storing circuit design data and constraints. Databases 14 may also include a reports database 22 (sometimes called a results database) that is used to store reports and other results of circuit analysis operations. If desired, database 22 may include a single results file, multiple results files, or results/report information stored using any other suitable data structures.

After the circuit designer's input has been entered and stored in databases 14, this input may be provided to a programmable logic device compiler (or compiler suite) or other suitable computer aided design tools 26, as shown by line 24. For example, if the circuit designer is constructing an application specific integrated circuit (ASIC), the input from the circuit designer may be provided to an ASIC computer aided design tool such as a place-and-route tool for constructing ASIC mask sets.

Tools 26 are run to produce output data and report data. The format for the output data produced by tool(s) 26 depends on the type of circuit being constructed. If, for example, the circuit designer is implementing a given circuit design in a programmable logic device, the output of the programmable logic device compiler may be provided in the form of programming data for configuring the programmable elements on a programmable logic device. If the circuit designer is implementing the circuit design in an ASIC, output data may be provided in the form of data for constructing lithographic masks for fabricating the ASIC as a silicon chip. The report data that is produced by tools 26 may include information such as predicted timing performance, power dissipation calculations, thermal modeling results, noise level projections, chip area and/or projected levels of on-chip resource consumption (e.g., the number of logic elements consumed on a programmable logic device), etc. These are merely illustrative examples of suitable report data that may be produced by running computer aided design tools 26. Any suitable results may be generated if desired.

The output and report data from tools 26 may be stored in databases 14, as shown by arrow 28. For example, reports on noise levels, temperature rises, timing performance, and resource consumption may be provided as one or more report files that are stored in report databases 22. Output data for programming a programmable logic device (as an example) may be provided in the form of a "*.pof" file or other suitable format. The output data may, if desired, be stored in database(s) 20.

The report data from database 22 and design and constraint data from database 20 may be obtained from databases 14 by optimization assistance tool(s) 32, as shown by line 30. Tool 32 may use optimization rules to analyze the design and constraint data and the report data. The results of this analysis may be used to provide the circuit designer with assistance on how to optimize the implementation of the circuit. For example, if the report data indicates that the implemented circuit is not meeting timing performance goals, the optimization assistance tool 32 can provide the circuit designer with recommendations on how to adjust the design and/or design constraints to meet those goals. The recommendations may include specific recommendations (e.g., to change certain design object settings) and general recommendations (e.g., to change an optimization mode setting in a particular design tool).

If desired, the recommendation information provided to the circuit designer by the optimization assistance tool 32 can include one or more links to online help. For example, the optimization assistance tool 32 can display a screen for the circuit designer that contains a specific web link pertaining to a problem area identified by the tool 32. When the circuit designer clicks on this web link, the circuit designer's web browser may be automatically launched. The web browser passes a web page request to an online help web server on the internet (or on any other suitable network). The web server passes the requested page to the web browser to display to the circuit designer. The process of obtaining online help information from an online help service 33 (web server) by clicking on a link provided in a recommendation screen is shown by arrow 35 in FIG. 2.

The help information provided using help service 33 should generally be descriptive enough to provide the circuit designer with an explanation of what the recommendation is, how it affects the design (e.g., speed versus area considerations), how it affects design processing (e.g., compilation time), and how effective it might be to apply the recommendation for various design situations. The help information may, for example, explain tradeoffs involved in applying various recommendations and may explain why certain settings have not been chosen as default settings in the tools 26. The help information may include links to online application notes that provide additional information about the particular recommendation or related information.

As part of providing the circuit designer with recommendations on how to optimize the circuit, the optimization assistance tool 32 can provide on-screen options for the circuit designer to select. When the circuit designer clicks on one of these on-screen options, the optimization assistance tool can automatically launch an appropriate design and constraint entry tool for the circuit designer, as shown by line 34. Because the circuit designer does not need to decide which tool to launch, the automatic launching of the appropriate design and constraint entry tool 16 helps the circuit designer save time and avoids potential mistakes during the design optimization process.

If desired, the optimization assistance tool 32 may provide information to the design and constraint entry tool 16 that is being launched to direct the tool 16 to display an appropriate screen for the circuit designer to make settings adjustments. The tool 32 may also provide information to the launched tool on particular design objects for which settings are to be adjusted. This makes it relatively easy for the circuit designer to make appropriate settings adjustments before recompiling (re-processing) the design with tools 26 to determine whether the recommended changes have helped optimize the design.

The type of computer aided design tools 12 (e.g., design and constraint entry tools 16 and tools 26 of FIG. 2) that are used to create an implementation of a given circuit design depend on what type of circuit implementation is being created. For example, certain computer aided design tools 12 (e.g., a compiler suite of programs) are used for creating programming data for programmable logic devices. Other computer aided design tools 12 (e.g., a place-and-route tools and various associated design and constraint entry and analysis tools) are used for creating mask sets for application specific integrated circuits and other integrated circuits.

Figure 3:
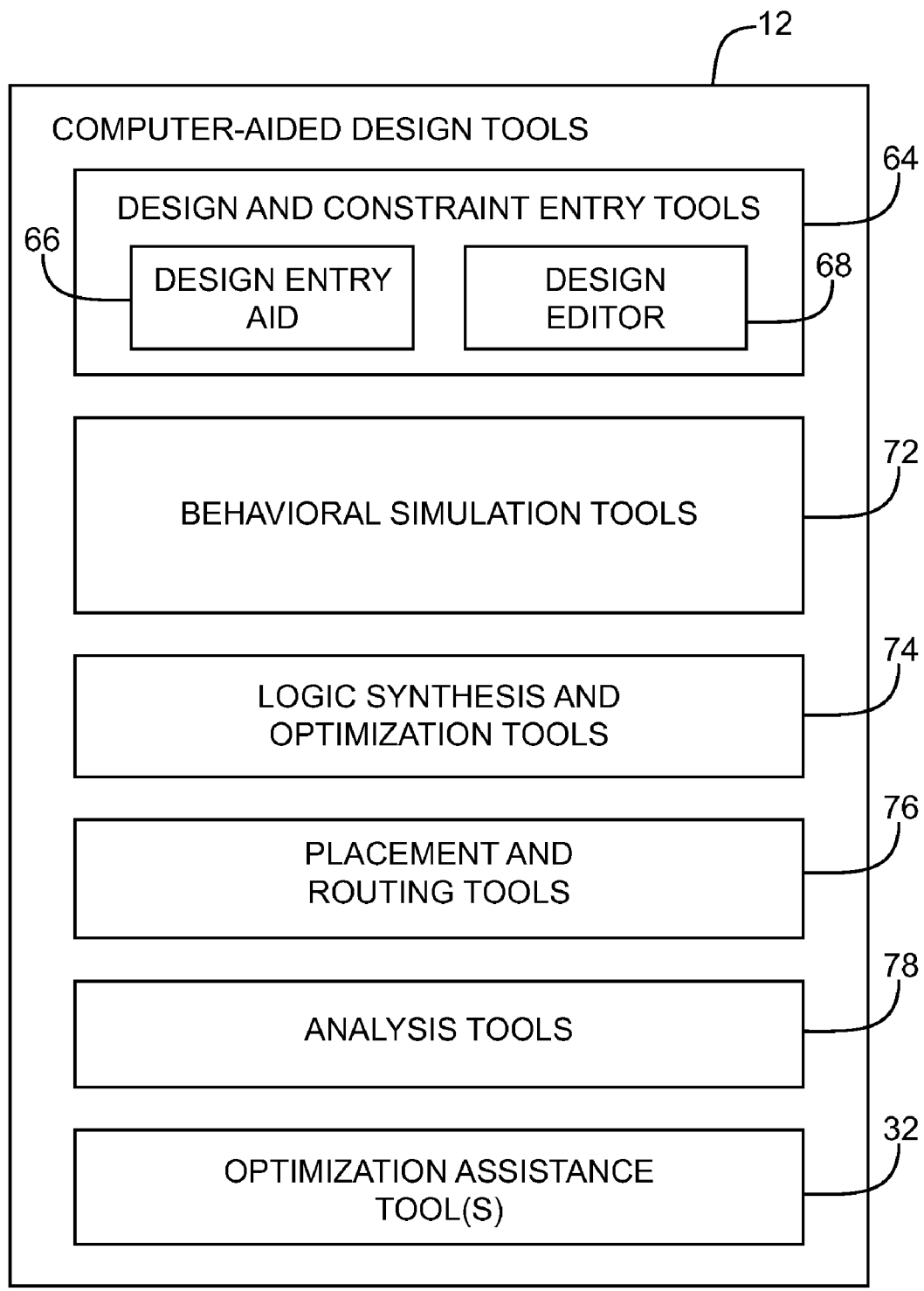
FIG. 3 is a diagram showing illustrative computer aided design tools with optimization assistance tools in accordance with the present invention.

An illustrative set of computer aided design tools 12 that may be used when generating and optimizing an implementation of a given circuit in a programmable logic device integrated circuit are shown in FIG. 3. The tools 12 shown in FIG. 3 may be implemented using a logic design system such as system 10 of FIG. 1.

Tools such as tools 12 of FIG. 3 may be used to produce programming data (configuration data) for a programmable logic device from a set of design specifications or other suitable input. The programming data may be electrically programmed or mask-programmed into a suitable programmable logic device to configure the programmable logic device to perform the functions set forth in the design specifications.

The design process typically starts with the formulation of logic circuit functional specifications. A logic designer can specify how a desired circuit should function using design and constraint entry tools 64. Design and constraint entry tools 64 may include tools such as design and constraint entry aid 66 and design editor 68. Design and constraint entry aids such as aid 66 may be used to help a logic designer locate a desired design from a library of existing logic designs and may provide computer-aided assistance to the logic designer for entering (specifying) the desired design. As an example, design and constraint entry aid 66 may be used to present screens of options for a user. The user may click on the on-screen options to select whether the circuit being designed should have certain features. Design editor 68 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 64 may be used to allow a logic designer to provide a desired logic design to using any suitable format. For example, design and constraint entry tools 64 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design and constraint entry tools 64 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 64 may allow the logic designer to provide a logic design to the logic design system 10 using a hardware description language such as Verilog hardware description language (HDL) or Very High Speed Integrated Circuit Hardware Description Language (VHDL). The designer of the logic circuit can enter the logic design by writing hardware description language code with editor 68. Blocks of code may be imported from user-maintained or commercial libraries if desired.

After the design has been entered using design and constraint entry tools 64, behavioral simulation tools 72 may be used to simulate the functional performance of the design. If the functional performance of the design is incomplete or incorrect, the logic designer can make changes to the design using design and constraint entry tools 64. The functional operation of the new design can be verified using behavioral simulation tools 72 before synthesis operations have been performed using tools 74. Simulation tools such as tools 72 may also be used at other stages in the design flow if desired (e.g., after logic synthesis). The output of the behavioral simulation tools 72 may be provided to the logic designer in any suitable format (e.g., truth tables, timing diagrams, etc.)

Once the functional operation of the logic design has been determined to be satisfactory, logic synthesis and optimization tools 74 may be used to implement the logic design in a particular programmable logic device (i.e., in the logic and interconnect resources of a particular programmable logic device product or product family).

Tools 74 attempt to optimize the design by making appropriate selections of hardware to implement different logic functions in the logic design based on the logic design data and constraint data entered by the logic designer using tools 64.

After logic synthesis and optimization using tools 74, the logic design system may use tools such as placement and routing tools 76 to perform physical design steps (layout synthesis operations). Placement and routing tools 76 are used to determine how to place the circuits for each logic function within the programmable logic device. For example, if two counters interact with each other, the placement and routing tools 76 may locate these counters in adjacent logic regions on the programmable logic device to minimize interconnect delays. The placement and routing tools 76 create orderly and efficient implementations of logic designs for a given programmable logic device.

Tools such as tools 74 and 76 may be part of a compiler suite (e.g., part of a suite of compiler tools provided by a programmable logic device vendor).

After an implementation of the desired logic design in the programmable logic device has been generated using placement and routing tools 76, the implementation of the design may be analyzed and tested using analysis tools 78. Tools 78 may include simulation tools such as timing simulation tools, tools for analyzing the types and numbers of multiplexers, logic elements, registers, and other resources that are consumed by this implementation of the design, tools for estimating power consumption, tools for analyzing temperature rises on various portions of the device, tools for analyzing noise conditions on various signal lines, etc. These are merely illustrative analysis tools 78 that may be used to analyze the performance of the implemented design. Any suitable simulation and analysis tools may be used if desired.

An example of an analysis tool 78 is a timing simulation tool. Timing simulation tools may be used to predict the delay times that are associated with certain signal paths through the device. The timing simulation tools may be used to verify that the particular implementation of the design that is being tested does not contain signal paths with delays that are outside of the limits imposed during the design phase. For example, the timing simulation tools may be used to ensure that the slowest data paths are fast enough that the minimum desired clock speed and minimum signal path delay constraints are satisfied. The timing simulation tools may also examine the design for potential race conditions or other conditions that affect device performance.

Tools such as tools 78 may produce reports and other simulation and analysis results. Report data may be store in a database such as report database 22 or may be otherwise made available or provided to optimization assistance tool(s) 32.

Optimization assistance tools 32 use the report data from analysis tools 78 and other data such as data on the logic design specifications and associated design constraints entered using tools 64 to analyze the implementation of the desired logic design. Potential problems with the design implementation and potential solutions to these problems may be presented to the logic designer. Selectable options may be presented that the designer can select to begin adjusting appropriate settings in design and constraint entry tools 64. For example, if the optimization assistance tool 32 determines that the location (placement) constraint on a particular circuit node or other design object in the designer's design is causing a problem, the optimization assistance tool may present the logic designer with a screen containing a selectable option to fix the placement constraint problem. If the logic designer clicks on the selectable option, the optimization assistance tool 32 may launch the appropriate design and constraint entry tool 64 so that the logic designer can make suitable adjustments to the current placement constraint settings being used. If desired, a design editor may be automatically launched so that the circuit design itself can be changed.

After satisfactory optimization operations have been completed using tools 12, tools 12 can produce the configuration data for the programmable logic device or can generate other suitable output data (e.g., the specifications for a lithographic mask set for fabricating an integrated circuit incorporating the logic design). Depending on the type of programmable logic device being used (e.g., a device based on non-volatile memory, a device based on volatile memory, a device based on fuses or antifuses, etc.), configuration data may be programmed into the programmable logic device directly or may be provided to a memory device that later (e.g., upon power-up) loads the configuration data into the programmable logic device to program the device.

If a circuit designer is designing circuitry for an integrated circuit other than a programmable logic device such as an application specific integrated circuit, microprocessor, digital signal processor, or other circuit, computer aided design tools 12 may produce specifications for a lithographic mask set for fabricating the integrated circuit. The optimization assistance tools 32 can be used to assist in the optimization of any suitable circuit design.

The features of the optimization assistance tools 32 may be provided as part of analysis tools 78 or any other suitable tools (e.g., any of the other tools in FIG. 3) or may be provided as separate tools. If desired, some optimization assistance tool features may be provided using stand-alone components while other optimization assistance tool features may be provided using software components built into other tools.

Regardless of the particular arrangement use to provide optimization assistance tool capabilities to the computer aided design tools, the optimization assistance tool is preferably able to assist the circuit designer in the optimization process by helping the circuit designer make appropriate adjustments to certain settings in the computer aided design tools. The settings are typically settings associated with design constraints such as timing constraints, power consumption constraints, noise level constraints, area constraints, location constraints, etc. Settings may be global or local. Certain settings may relate to mode selections used for performing logic synthesis and optimization operations (e.g., using tools 74). Other settings may relate to particular design objects (e.g., when a particular circuit node is assigned a particular location in a particular logic block on a programmable logic device).

The optimization assistance tools 78 may be invoked automatically or manually. Tools 78 are preferably invoked after a circuit designer has run a compilation (synthesis) to make more data available for analysis. Before a compilation has been performed, general design assistance can be provided.

Figure 4:
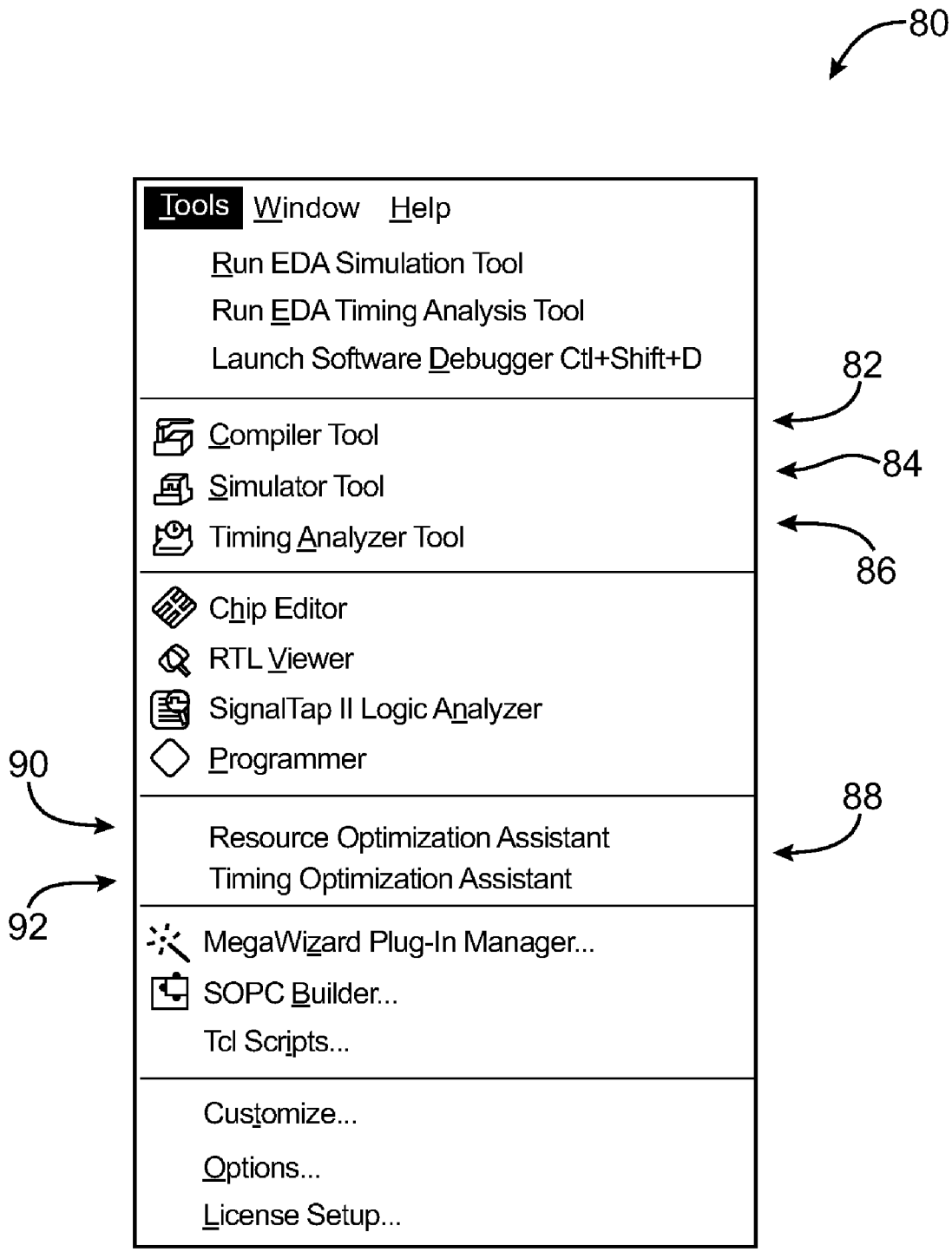
FIG. 4 shows an illustrative computer aided design tool menu with optimization assistant options in accordance with the present invention.

An illustrative screen that may be used by a circuit designer to launch optimization assistance tools 78 is shown in FIG. 4. In the example of FIG. 4, a drop-down menu is used to provide on-screen options to the circuit designer. This is merely one illustrative type of user interface that may be used to invoke tools 78.

In the example of FIG. 4, menu 80 contains an option 82 that may be selected to launch a design compiler (e.g., tools such as tools 74 and 76 of FIG. 3). Option 84 may be used to launch a tool such as tool 72 of FIG. 3. Option 86 may be used to launch a timing simulator tool (e.g., an analysis tool 78 of the type shown in FIG. 3).

Optimization assistance options 88 may be used to launch an appropriate optimization assistance tool 32. If desired, a child window can be opened within the circuit designer's computer aided design tool 12 when the tool 32 is launched.

In the example of FIG. 4, there are two optimization assistance tool options. The resource optimization assistant option 90 may be selected to access functions related to resource optimization. The timing optimization assistance option 92 may be selected to access functions related to timing optimization. These are merely illustrative examples. Optimization assistance may be obtained using any suitable arrangement (e.g., using more options, using a single option, etc.).

Figure 5:
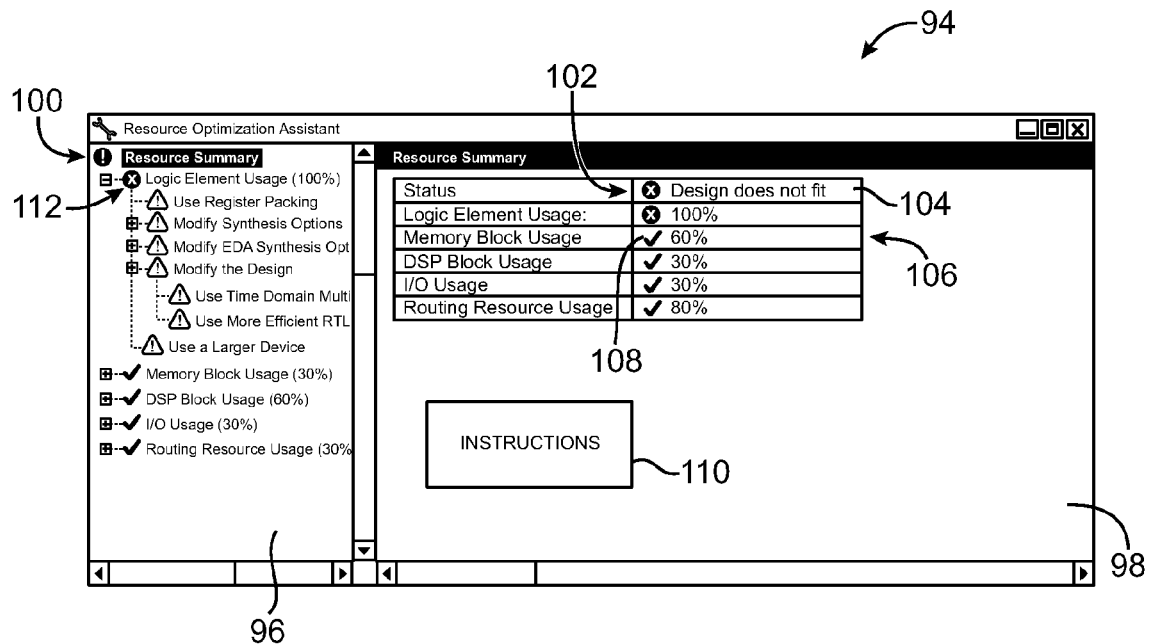
FIG. 5 shows an illustrative summary screen that may be displayed for a circuit designer to provide the circuit designer with information on potential problem areas for a given circuit and associated status information in accordance with the present invention.

If the circuit designer selects resource optimization assistant option 92, tools 32 may present the circuit designer with a screen such as screen 94 of FIG. 5. Screen 94 contains a "control tree" navigation menu portion 96 and a main window 98. The region 96 may contain information on basic problems and recommendations. With one illustrative approach, potential problems are displayed as a list/tree of selectable options (e.g., logic element usage 100%, memory block usage, I/O usage, etc.) Under a potential problem such as "logic element usage 100%", region 96 may contain entries related to recommendations (e.g., use register packing, modify synthesis operations, etc.). The information in region 96 may be static for a given device family. Each time that a circuit designer opens the optimization assistance tool 32, the same potential problems and recommendations may be shown. This consistency may make it easier for a circuit designer to step through a series of recommended solutions to examine their potential impact. If desired, the list of potential problems and recommendations may differ for different device families.

The recommendations that are presented may be displayed in a particular order. For example, recommendations may be displayed in order of decreasing importance. With this type of approach, the recommendations that are most significant are displayed at the top of the screen, where the circuit designer will encounter them first. Recommendations may also be displayed in order of increasing difficulty. For example, a recommendation to modify the circuit designer's basic design, which is typically difficult, may be displayed further down in the list in region 96 than a recommendation to adjust settings that modify the way in logic synthesis operations are performed by tools 12.

Hybrid ordering approaches may also be used. With a hybrid approach, recommendations for the potential problems may be displayed in an order that takes into account how important the recommended changes are and how difficult it is to make the recommended changes. As an example, the optimization assistance tool may generally attempt to display the most important and significant recommendations first, but may temper this ordering scheme when appropriate by displaying the more difficult of these recommended changes later (i.e., nearer the bottom of the screen). In this way the circuit designer is provided with important recommendations as soon as possible, while the practical difficulty of making extremely difficult changes is taken into account. These are merely illustrative arrangements for ordering recommendations for settings changes. Any suitable ordering scheme may be used if desired.

In the example of FIG. 5, the "resource summary" entry 100 in control tree 96 has been selected, so a summary of resource utilization information is provided in window 98.

Screen 94 and other screens provided by the optimization assistance tool 32 may use icons to inform the circuit designer of potential problems with the current implementation of the circuit designer's design. The icons can convey information about problem severity. A red "X" icon may be used to indicate a potential problem that the circuit designer should investigate. A green check icon may be used to indicate that no obvious problems with a particular aspect of the implementation have been detected. A yellow "!" icon may be used to indicate caution. Prudent circuit designers can investigate potential problems that have been marked with the caution icon if they have time. An information icon "i" may be used to label menu entries that correspond to general advice. Different icon schemes or schemes with no icons or more icons may be used if desired.

As shown in the example of FIG. 5, region 98 contains an X icon 102 and an associated problem description 104 indicating that the circuit designer's logic design will not fit within a particular type of programmable logic device. This illustrative problem represents an outright violation of a particular constraint (i.e., the chosen device type is too small for the design). Other aspects of the implementation are satisfactory. For example, only 60% of the available memory blocks will be consumed in this implementation, which is satisfactory, as indicated by icon 108 and entry 106. If desired, instructions (e.g., text explaining what actions the circuit designer might want to take to improve the implementation) may be provided in region 98, as indicated by instructions area 110.

In some situations, the optimization assistance tool 32 may provide information on actions to take to change global settings. An example of a recommendation to change a global setting is a recommendation to adjust a global synthesis option. These types of recommendations may involve taking actions such as setting the options appropriately or taking no action because the setting is already correct. The optimization assistance tool 32 may provide global settings recommendations that are similar or the same for a wide variety of designs. The optimization assistance tool 32 may also provide settings recommendations that are derived from particular aspects of the circuit designer's design. For example, advice on adjusting a state machine setting in a design may be provided if the design includes a state machine (but not otherwise).

Sometimes recommendations will be made to change specific settings related to a circuit designer's design (e.g., placement constraints). Recommendations may also be made to a circuit designer to make manual changes (e.g., to manually change the coded description of the circuit design using a text editor).

In the illustrative screen 94 of FIG. 5, the circuit designer can select from among the problem areas listed in region 96 to obtain more information from the optimization assistance tool. If, for example, the circuit designer selects the logic element usage entry 112 of FIG. 5, the optimization assistance tool 32 can display a problem area page or screen such as screen 114 of FIG. 6.

Figure 6:
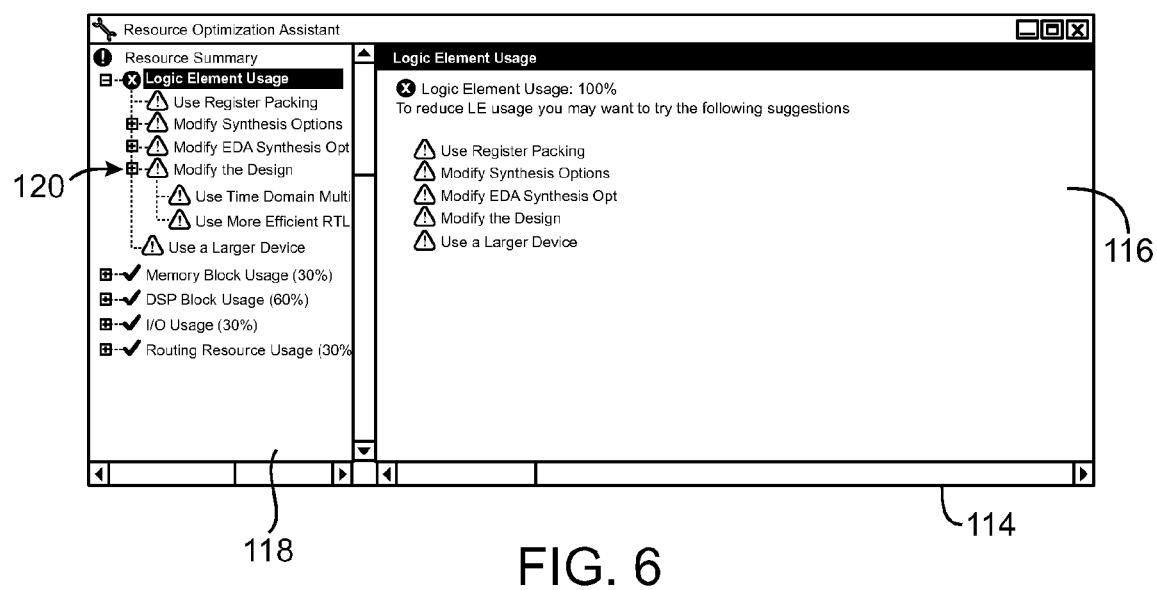
FIG. 6 shows an illustrative problem area screen that may be displayed for a circuit designer when the designer selects one of the problem areas listed in the summary screen of FIG. 5 in accordance with the present invention.

Problem screens such as screen 114 of FIG. 6 may be used to present the circuit designer with a list of recommendations pertaining to the selected problem area. In this example, the potential problem area identified by the optimization assistance tool relates to logic element usage, so screen 116 contains information in region 114 on recommended ways in which to make improvements in this area (e.g., use register packing during compilation, modify synthesis options, etc.). The circuit designer may select an option from among the options and suboptions listed in region 118 to obtain additional options/information on a particular proposed solution. For example, if the user clicks on the "modify the design" option 120 of FIG. 6, the optimization assistance tool 32 may display a screen such as recommendation screen 122 of FIG. 7.

Figure 7:
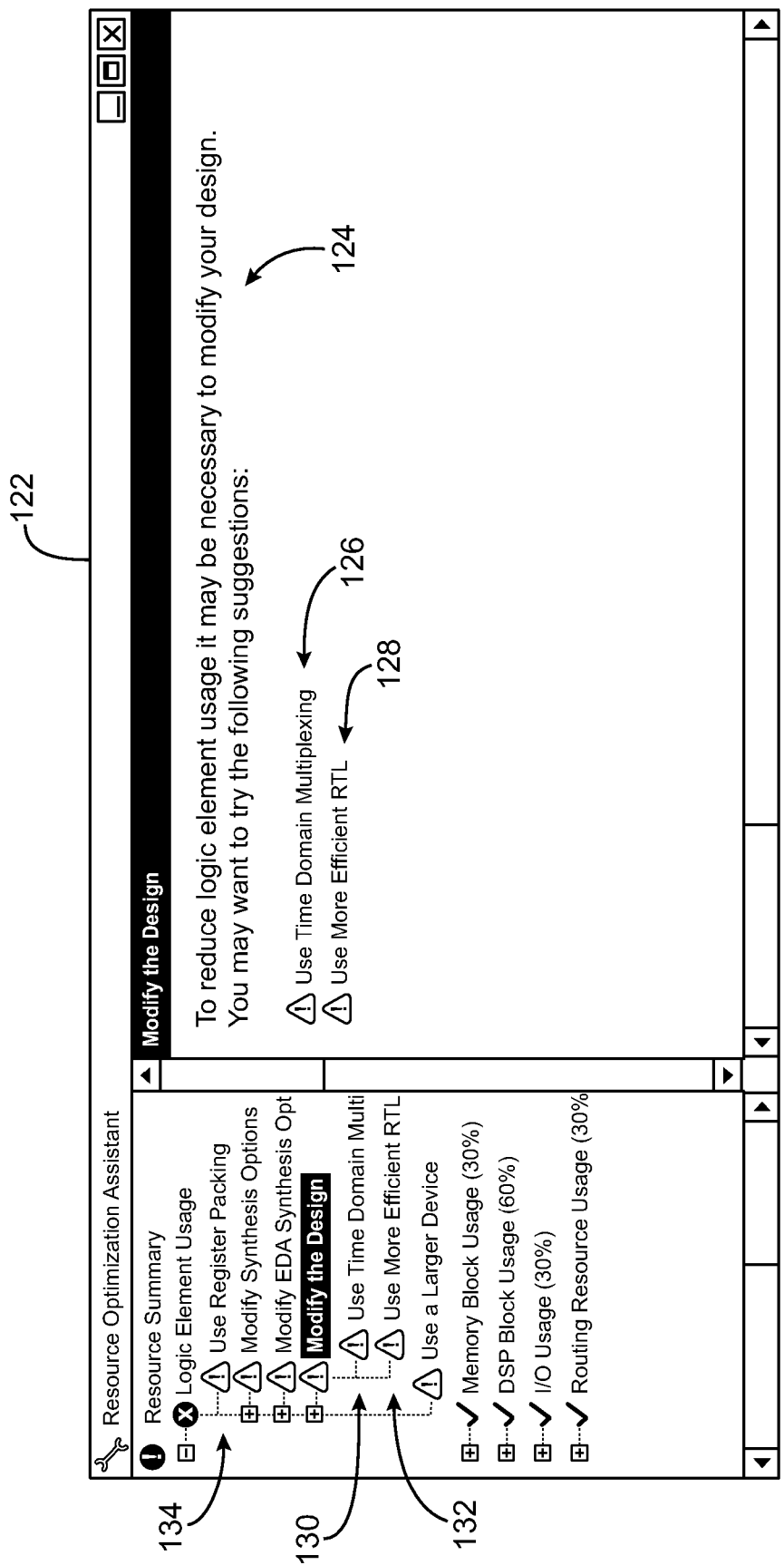
FIG. 7 shows an illustrative recommendation screen that may be displayed for a circuit designer to list recommended changes the designer may make to address problem areas in accordance with the present invention.

As shown in FIG. 7, screens such as screen 122 may contain text information 124 and associated options 126 and 128 that help the circuit designer understand the nature of the potential problem area that has been identified and proposed solutions. Options 126 and 128 (and/or corresponding tree options 130 and 132) may be selected to obtain additional assistance.

When there are multiple recommendations associated with a particular problem area, the optimization assistance tool can group the recommendations in an organized way. For example, a screen such as recommendation screen 122 may be presented that contains all or at least some of the recommendations that pertain to a particular problem. When the circuit designer clicks on an option in screen 122 that is associated with a particular recommendation, the optimization assistance tool 32 may display a screen that contains more detailed information about the selected recommendation. This may include an overview of the recommendation and a link to more detailed information. The link may be, for example, a web link to an web site associated with a programmable logic device vendor or other source of online help information. Information on the expected impact of the recommendation on the implementation of the circuit design may also be presented. To assist the user in executing the recommendation, detailed information may be presented on which actions the circuit designer should take to apply the recommendation.

When presenting recommendations on how to solve potential problems, the optimization assistance tool 32 may present the circuit designer with selectable options that the circuit designer can select to obtain more information (e.g., information from an online help site) and/or to automatically launch appropriate computer aided design tools 12 (e.g., design and constraint entry tools 16) to make settings adjustments to address the problem. For example, if the circuit designer selects "use register packing" option 134 in screen 122, the circuit designer can be presented with a screen such as recommendation screen 136 of FIG. 8.

Figure 8:
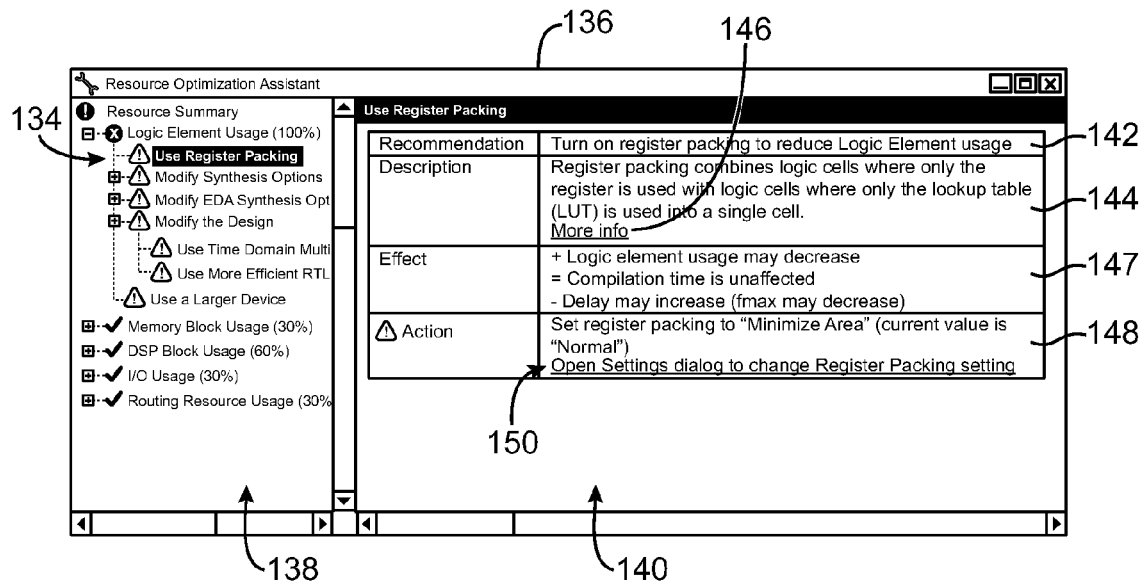
FIG. 8 shows an illustrative recommendation screen with a recommended action for a circuit designer in accordance with the present invention.

As shown in FIG. 8, the selected option 134 may be highlighted in region 138. Region 140 may be used to present information related to the selected option. Region 142 may be used to present an overview of the recommendation (e.g., a suggestion to turn on the register packing feature in the programmable logic device design software so that logic elements can be used more efficiently). More detailed information on the register packing feature may be presented in region 144. More info link 146 may be selected to launch the circuit designer's web browser and display an appropriate web page from a help web site. Area 147 may be used to display information on the effects that are anticipated if the circuit designer implements the recommendation (i.e., if the circuit designer turns on the register packing option). Action region 148 provides information on how the circuit designer should or could adjust the register packing setting in the design and constraint entry tools 16 (i.e., by changing the register packing mode from "normal" to "minimize area").

To assist the circuit designer in locating the appropriate computer aided design tool 12 that is needed to implement a recommendation, optimization assistance tool 32 may provide selectable options such as selectable option 150. If the circuit designer clicks on option 150, the appropriate design and constraint entry tool 16 will be automatically launched by the optimization assistance tool 32, as shown by line 34 of FIG. 2. If desired, the optimization assistance tool 32 may direct the launched tool 16 to display an appropriate screen within the launched tool. This screen can be populated with information on particular settings that is provided to the launched tool by the optimization assistance tool 32. In the example of FIG. 8, clicking on option 150 causes the optimization assistance tool 32 to open a "settings" dialog page in a design tool 16 where the circuit designer can change the settings pertaining to register packing.

Sometimes no action is required on the part of the circuit designer. For example, recommendations from the optimization assistance tool may not require any action on the part of the circuit designer because the recommended action has already been taken. In some instances, actions that would otherwise be recommended are not applicable, because they are not valid for the design in question.

Figure 9:
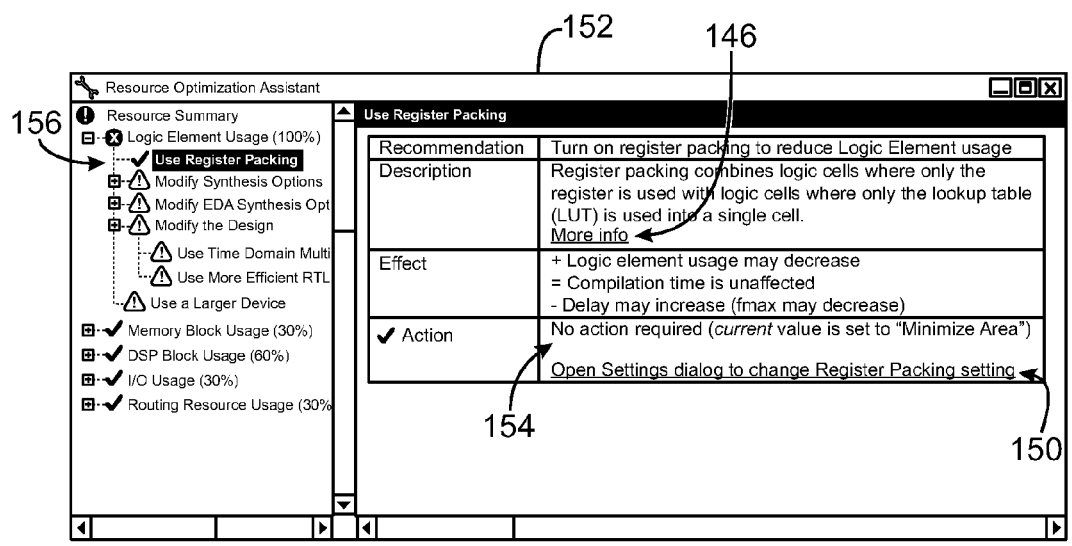
FIG. 9 shows an illustrative recommendation screen that does not contain any recommended actions for a circuit designer in accordance with the present invention.

An illustrative screen 152 that optimization assistance tool 32 can display for the circuit designer in a situation in which no action is required is shown in FIG. 9. In the example of FIG. 9, the "recommendation" is to turn on the register packing option to reduce logic element usage. As indicated by instruction 154, no action is required, because the current value of the "register packing" setting is "minimize area." No further decrease in area is possible in this example, so the circuit designer need not take any actions to change the register packing setting. As shown by icon 156, the optimization assistance tool 32 can display a visual indicator to the circuit designer to indicate that the current setting is acceptable and that no changes to this setting are recommended.

Although no changes to the register packing setting are needed (or are available) to overcome the illustrative logic element usage problem of this example, screen 152 may contain selectable options such as more info link 146 and open settings dialog option 150. The circuit designer can use link 146 to obtain additional information about register packing and can use option 150 to change the register packing mode (e.g., if the circuit designer is planning to switch to a programmable logic device with more available resources or desires to investigate the impact of adjusting the register packing mode).

In the "register packing" example, the optimization assistance tool 32 recommended that the circuit designer change a setting for a compilation (or synthesis) mode for the computer aided design tools 12. When the register packing mode is "normal," the design will generally be implemented in a way that consumes more logic element resources on a given type of programmable logic device than when the register packing mode is "minimize area." The optimization assistance tools 32 can also provide recommendations and options related to specific elements of the design such as circuit nodes, transistors and other electrical components, conductive lines, and other circuit elements. These specific items in a circuit design are referred to as "design objects."

Consider an example in which a circuit designer has decided that certain circuit nodes should be assigned to particular locations on programmable logic device. The circuit designer may assign circuit nodes to certain logic regions because the circuit designer believes from experience that this will result in good performance. The circuit designer may input constraints such design object constraints using design and constraint entry tools 16. After the compiler runs and a report on the implementation of the design is produced, it may turn out that the circuit designer's placement of these circuit nodes over-constrained the design process. The optimization assistance tool 32 can then provide assistance to the circuit designer that helps the circuit designer change settings related to placement constraints.

Figure 10:
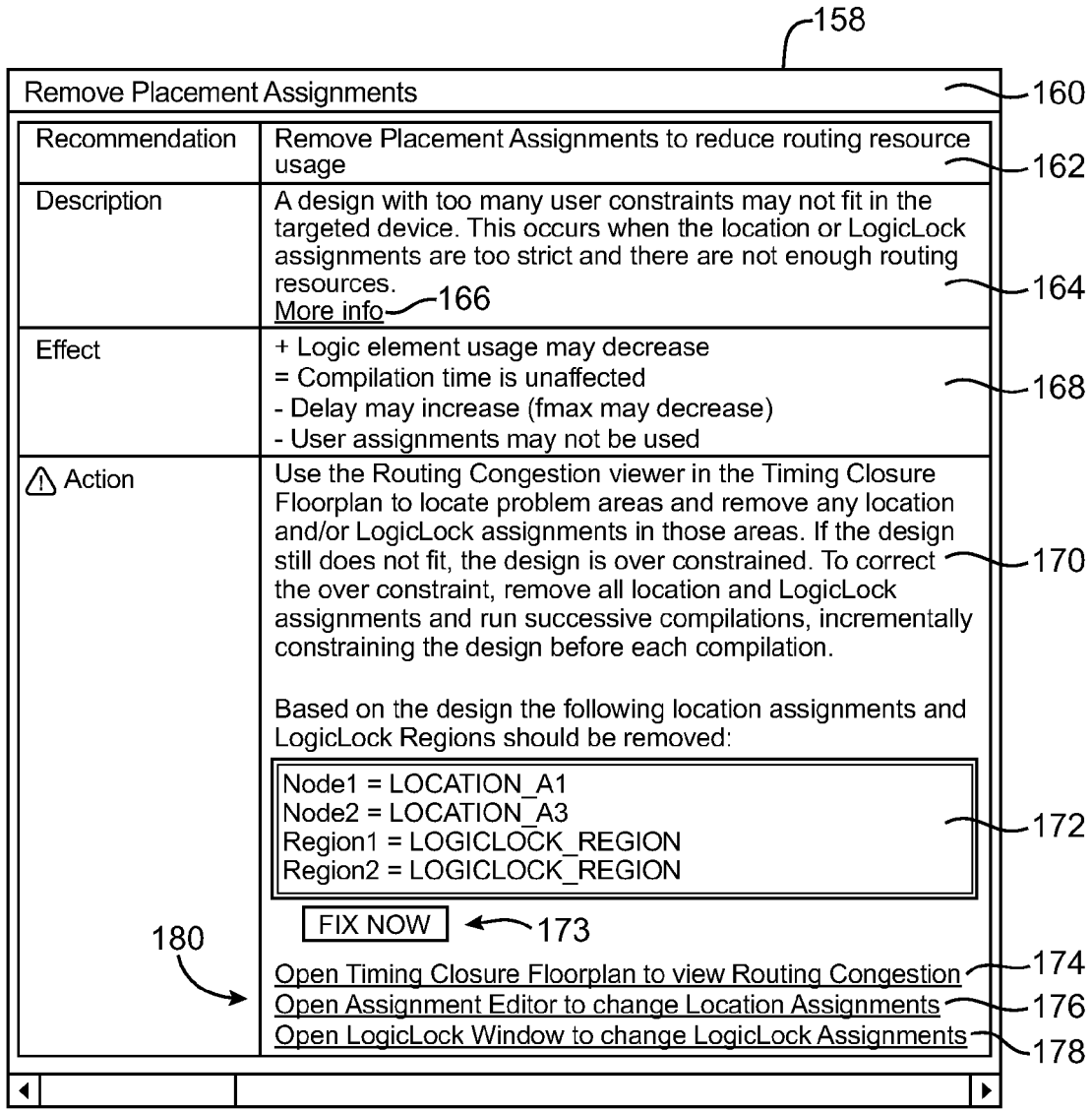
FIG. 10 shows an illustrative screen that may be displayed for a circuit designer to provide the designer with information on specific design objects for which settings may be changed to address potential problems in accordance with the present invention.

An illustrative potential problem screen 158 of the type that optimization assistance tool 32 may display for a circuit designer when the optimization assistance tool 32 determines that there is a potential problem with the current placement constraints the designer has made is shown in FIG. 10. As shown in FIG. 10, screen 158 may include a title 160 indicating the type of potential problem and recommendation that is involved. Recommendation region 162 may be used to present an overview of the optimization assistance tool's recommendation to the designer. Description region 164 may be used to provide additional detail about the problem and recommended solution. The circuit designer can click on option 166 to obtain more information from a help website. The effect region 168 may be used to describe the likely effects of the proposed change.

Action region 170 may be used to provide detailed information on what actions the circuit designer should take in interacting with computer aided design tools 12 to implement the recommendations being made. In this example, the circuit designer has been instructed to use the routing congestion viewer in the timing closure floorplan tool to locate problem areas and make changes to related settings.

Information on current settings may be provided in region 172 of action region 170. In region 172 of FIG. 10, information is provided on the placement constraints that have been given to various design objects. The information in regions such as region 172 may be gathered from the databases 20 and 22 automatically by the optimization assistance tool 32 or may be gathered by the tool when the designer clicks on an appropriate option (e.g., a "get detail" option in a screen such as screen 158).

If desired, a "fix now" button 173 may be provided. When the user selects the fix now option, the optimization assistance tool will automatically invoke the correct tools 12 and make appropriate changes to their settings to implement the recommendations. Intermediate confirmation screens may be provided to ensure that settings that the designer does not want to change are not inadvertently changed by the fix now feature. Such confirmation screens may, for example, contain check boxes that the circuit designer can uncheck when it is desired to forgo a particular recommended change to current settings.

The optimization assistance tool 32 may provide options 180 to allow the circuit designer to access the appropriate tool 12 to make recommended settings changes. Option 174 may be selected to open a floorplan editor. An constraint editor tool may be opened by clicking on option 176. A particular window in another computer aided design tool 12 may be opened by selecting option 178. Options 180 are merely illustrative options that may be used to invoke tools 12 to make changes to the circuit design and design constraints. Any suitable format for options such as options 180 may be used if desired.

Figure 11:
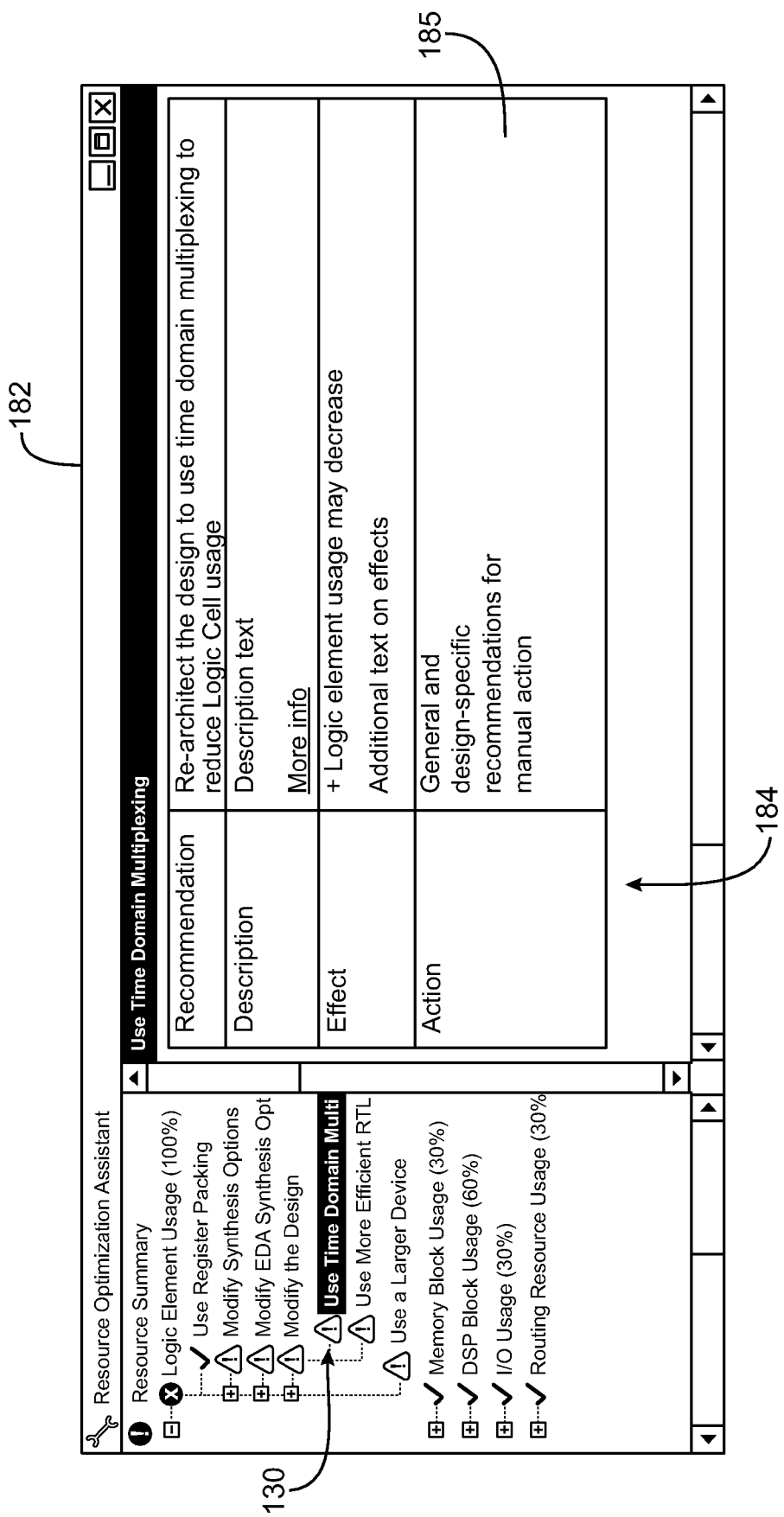
FIG. 11 shows an illustrative recommendation screen that may be displayed to provide a circuit designer with recommendations that the circuit designer may manually implement in accordance with the present invention.

An example of a screen 182 that optimization assistance tool 32 can display to provide a circuit designer with a recommended manual action is shown in FIG. 11. In the example of FIG. 11, the circuit designer has selected "use time domain multiplexing" option 130, so the information displayed in region 184 relates to using a time-domain multiplexing function when implementing the design to reduce logic element usage. Action region 184 may be used to display general and specific recommendations for the circuit designer to implement manually.

Figure 12:
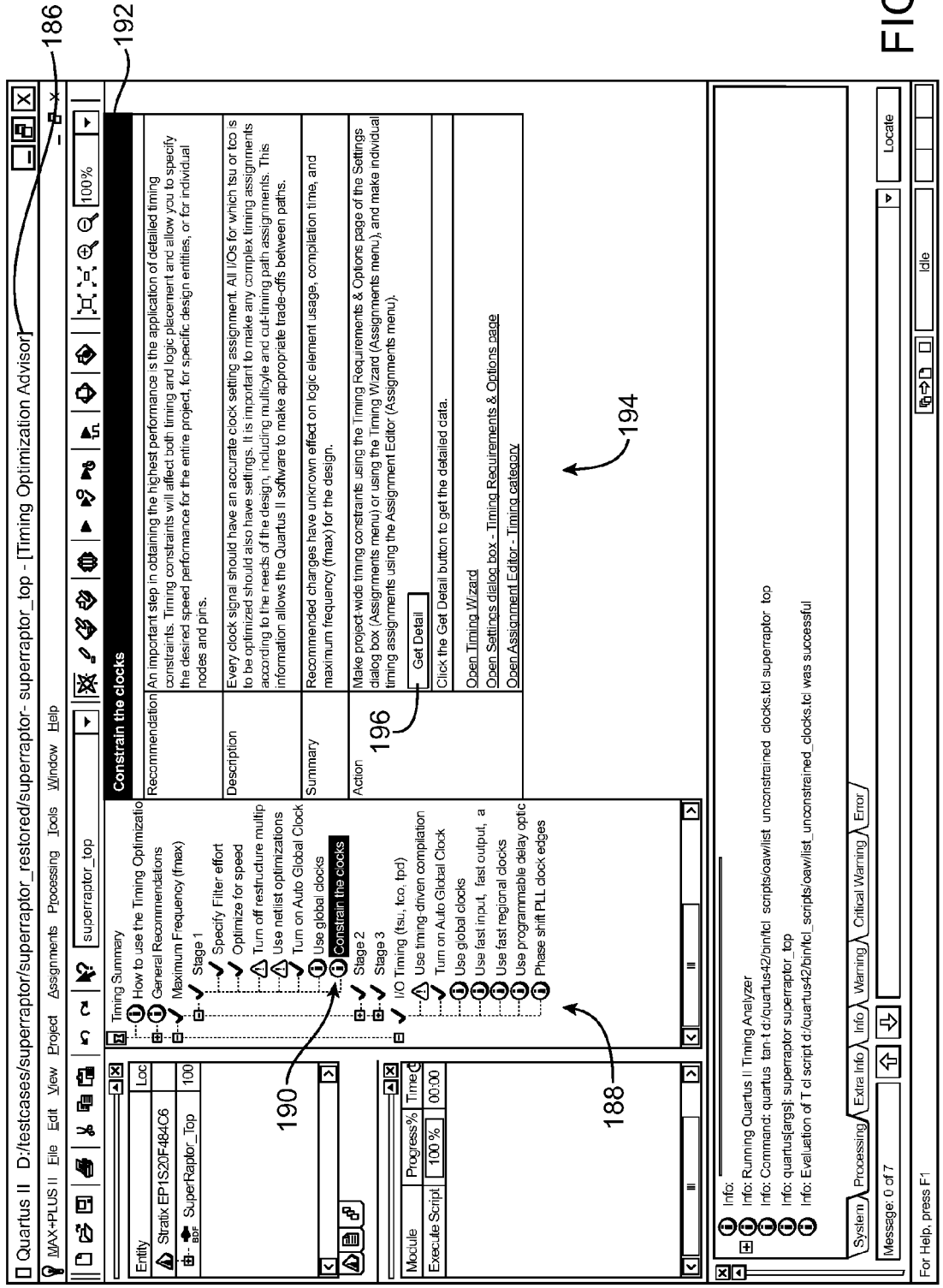
FIG. 12 shows an illustrative screen that may be displayed for a circuit designer by an optimization assistance tool to assist the circuit designer in improving timing performance for a given circuit in accordance with the present invention.

An illustrative set of screens that the optimization assistance tool 32 can display for the circuit designer when the circuit designer selects an option such as timing optimization assistant option 92 of FIG. 4 is shown in FIGS. 12-15. As shown in FIG. 12, a timing optimization assistant recommendations screen 186 may be displayed that contains a list 188 of selectable potential problem areas that are related to timing. In the example of FIG. 12, the circuit designer has selected "constrain the clocks" option 190, so title 192 and the other information in region 194 is related to clock-related design constraints.

Screens such as screen 186 may include options such as get detail option 196. The circuit designer can click on option 196 to obtain additional information on the current implementation of the circuit designer's design. When the designer clicks on option 196, the optimization assistance tool 32 can access databases 14 to obtain information on the design and constraints provided by the designer and report data from the computer aided design tools that have been run and to analyze the information that is obtained to decide what type of information to display and which recommendations to present to the circuit designer. Deferring the processes of gathering and analyzing this information until the designer actively clicks on the get detail button 196 may allow screens such as screen 186 to be displayed rapidly. If desired, some or all of the information obtained when button 196 is selected may be gathered and displayed automatically.

Figure 13:
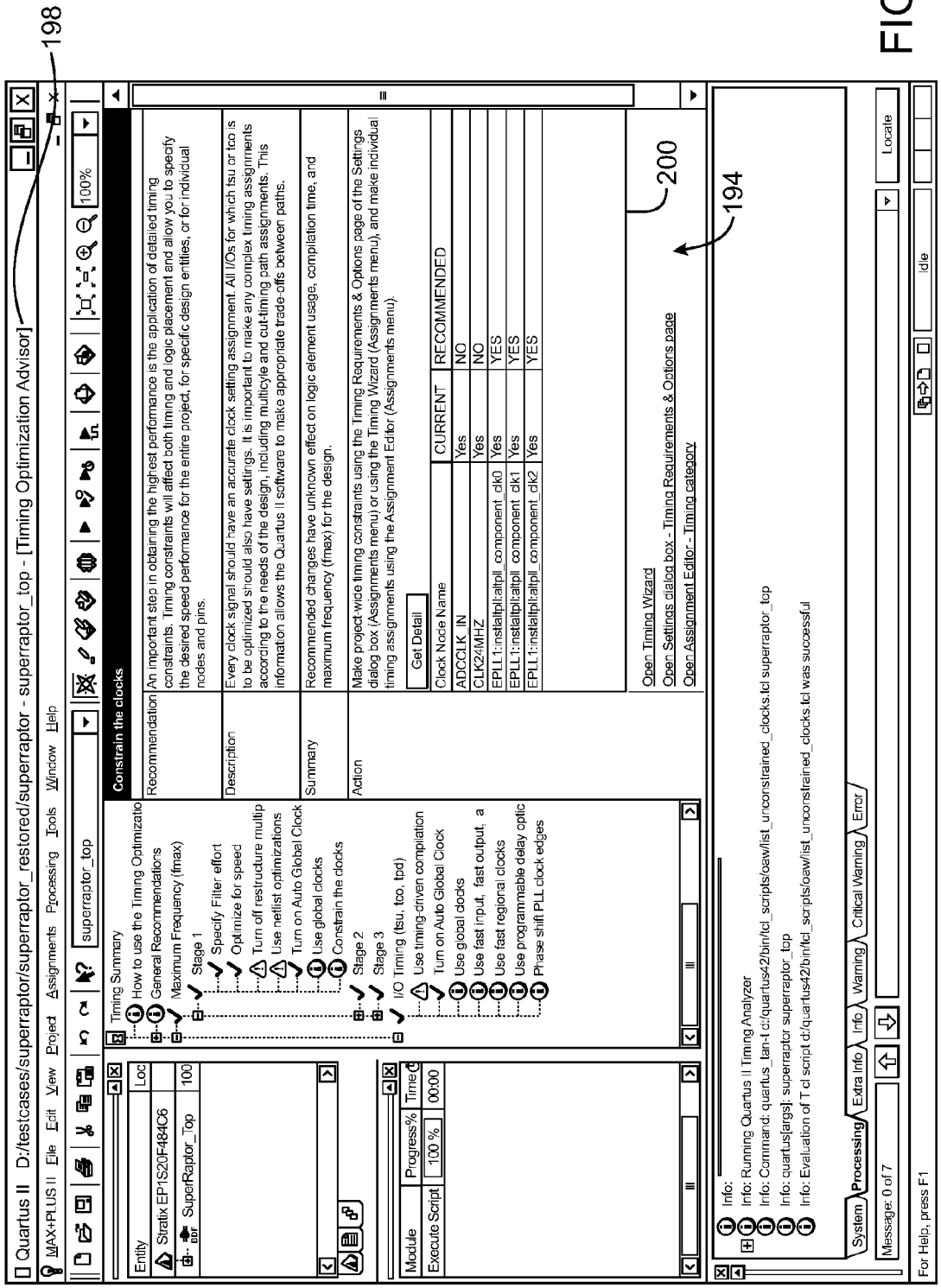
FIG. 13 shows how additional detail on various design objects may be provided when the circuit designer selects an option such as the get detail option of FIG. 12 in accordance with the present invention.

When the circuit designer clicks on option 196, the optimization assistance tool may display a screen such as screen 198 of FIG. 13. As shown in FIG. 13, region 194 of screen 198 may contain a region 200 that contains specific details about the designer's current settings and information on recommended settings. In the FIG. 13 example, the optimization assistance tool has identified five particular design objects in the designer's design that are potentially affected by timing optimization issues. The names of the design objects are listed in the leftmost column of the table of region 200. The current timing-related settings value for each of the five design objects is listed as "YES" under the column labeled "current." Under the column labeled "recommended," the corresponding settings values that have been recommended by the optimization assistance tool 32 are displayed. The circuit designer can compare the current and recommended settings for each design object to determine whether adjustments are warranted. The designer can then use the optimization assistance tool 32 to help launch the appropriate tools 12 to make the desired adjustments.

Figure 14:
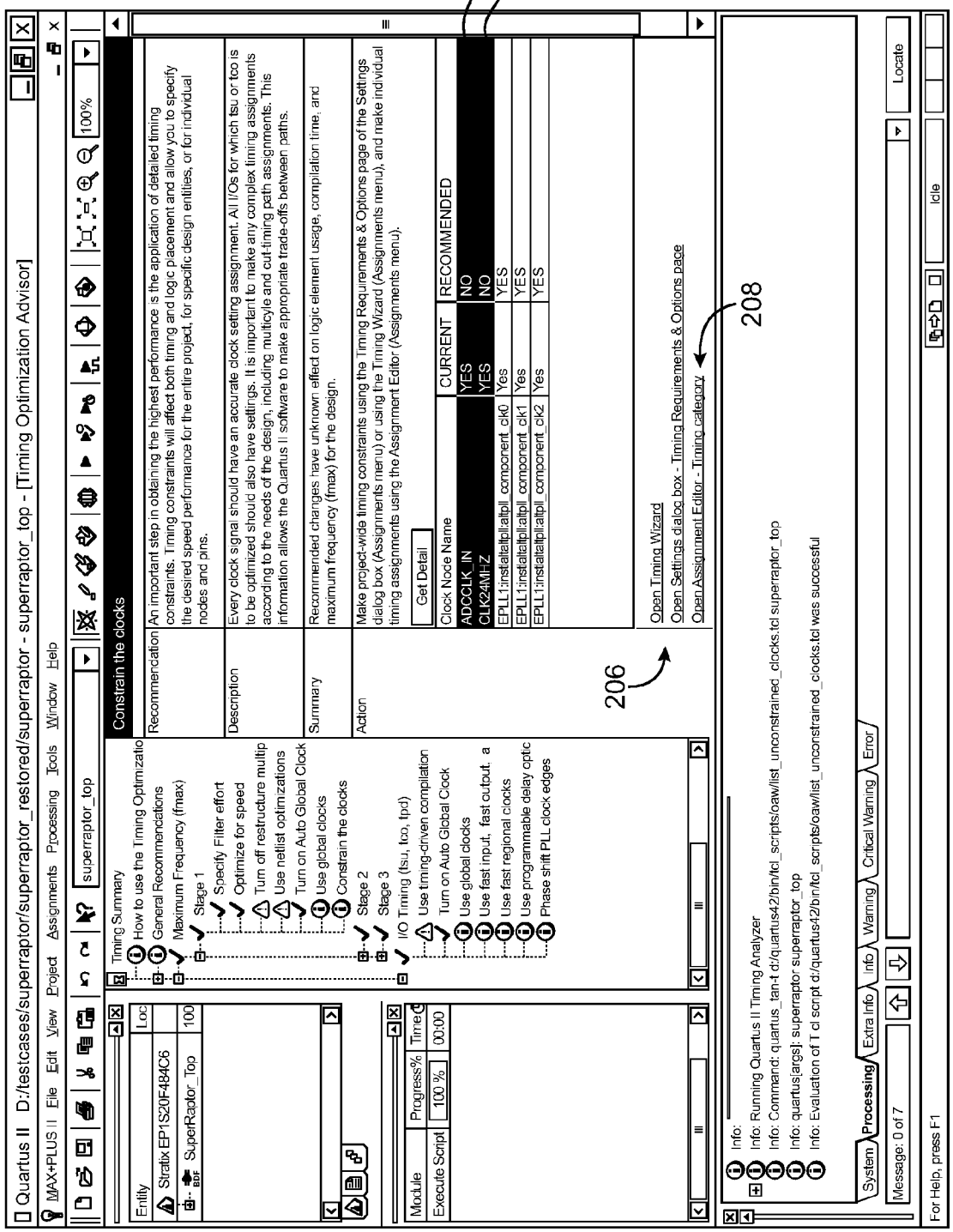
FIG. 14 shows how the circuit designer can select certain desired design objects from the list of design objects in the screen of FIG. 13 in accordance with the present invention.

If, for example, the circuit designer would like to change the settings for the design objects listed in the top two rows of the table of region 200, the circuit designer can highlight these rows as shown by highlight regions 202 and 204 in FIG. 14 (e.g., by clicking on these rows or through any other suitable arrangement). After the desired rows have been highlighted, the designer can select one of options 206 to launch an appropriate computer aided design tool 12 (e.g., a design and constraint entry aid 16 or a compiler tool 26).

The circuit designer may, for example, click on "open assignment editor" option 208 to direct the optimization assistance tool 32 to launch a constraint editor tool 12 that allows the circuit designer to make settings adjustments related to placement constraints. By launching a computer aided design tool 12 directly from an optimization assistance tool display screen, the circuit designer need not search for the appropriate tool manually. Moreover, the optimization assistance tool 32 may provide the launched tool with information on the settings and design objects that are involved, so that the circuit designer need not locate and enter this information manually.

If desired, the optimization assistance tool 32 may be used to make changes directly, without launching other computer aided design tools 12. When the optimization assistance tool 32 serves as a design/constraint editor in this way, the circuit designer need not always immediately launch tools such as design and constraint entry aid 16 to make settings adjustments.

Figure 15:
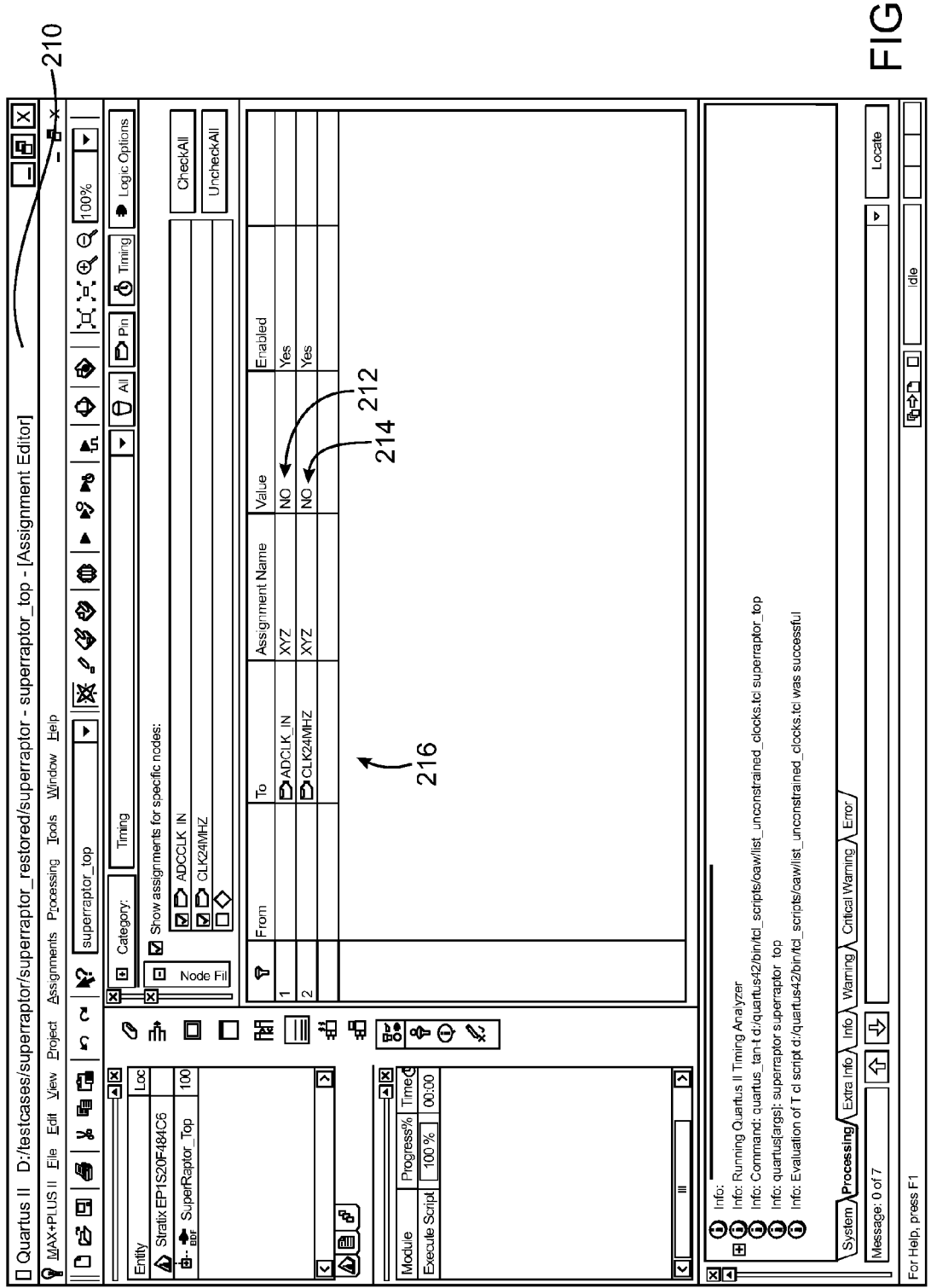
FIG. 15 shows an illustrative screen that may be displayed when the circuit designer selects an option on the screen of FIG. 14 to launch an appropriate circuit design tool in accordance with the present invention.

An illustrative screen 210 that may be displayed when the circuit designer selects option 208 of FIG. 14 is shown in FIG. 15. Screens such as screen 210 may be displayed by the launched computer aided design tool (e.g., aid 16) or by an optimization assistance tool 32 with built-in design and constraint entry capabilities. In screen 210 of FIG. 15, each of the design objects that was highlighted with a highlight region (202 and 204 of FIG. 14) is displayed in table 216. The current settings value for each constraint is shown in the column labeled "value." In this example, the current settings for these design objects is "NO," because the designer has changed these values from their original settings in response to the recommendations of FIG. 14. Any suitable arrangement may be used by the circuit designer to adjust settings. For example, the circuit designer can double click on NO value 212 or NO value 214 to toggle the relevant setting to "YES." After changing the logic design and/or logic design constraints for the circuit designer's design using the appropriate computer aided design tools such as the design and constraint editor tool, the circuit designer can compile the new design. The designer can then use the optimization assistance tool 32 again to determine whether problem areas remain or whether the implementation is satisfactory.

Figure 16:
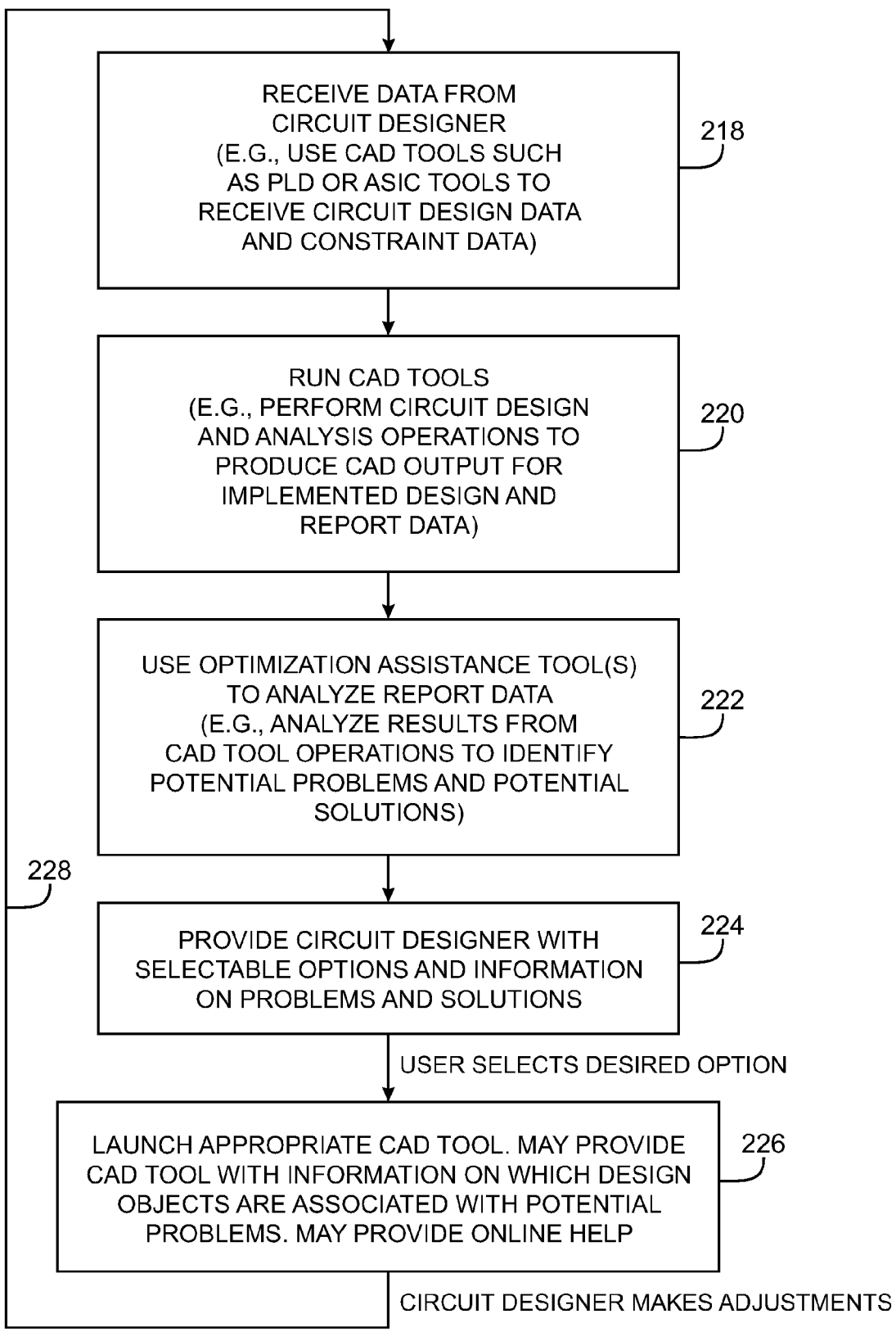
FIG. 16 is a flow chart of illustrative steps involved in using computer aided design tools with optimization assistance features to provide a logic designer with assistance in creating a optimal integrated circuit in accordance with the present invention.

Illustrative steps involved in using system 10 are shown in FIG. 16.

At step 218, a circuit designer provides computer aided design tools 12 such as design and constraint entry tools 16 of FIG. 2 with input. The input data may be in the form of design data (e.g., specifications for a logic circuit or other circuit) and constraint data (e.g., settings that set limits on acceptable circuit performance and settings that control how the computer aided design tools 12 should process the designer's input). As an example, step 218 may involve the construction and entry of a logic circuit design to be implemented in a particular type of programmable logic device with certain size and timing constraints. The tools used to enter the logic circuit input data include tools such as text editors, floorplan editors, constraint editors, library-based and wizard-based design and constraint entry aids, etc. As another example, the design and constraint data entered at step 218 may relate to a circuit design that is to be implemented as an application specific integrated circuit (ASIC). In this context, a typical computer aided design tool 12 for accepting design and constraint data is a place-and-route tool. In general, any suitable format may be used for design and constraint data. Constraint data may include information on any suitable constraints (e.g., design object placement constraints, timing constraints, area constraints, noise level constraints, power consumption constraints, thermal constraints, etc.) Design and constraint data may be stored in databases 14 (FIG. 2).

At step 220, computer aided design tools 12 may be run to implement the circuit design. If, for example, the design is a logic design for a particular type of programmable logic device integrated circuit, tools of the type shown in FIG. 3 may be used to implement the logic design in a target technology. These tools may include a logic compiler and other programs of the type that are typically provided as a suite of logic design and analysis tools. Programming data (e.g., in a .pof file) or other suitable output data representing the implemented design and report data including results of performance analysis operations may be generated. If the design is a circuit design for an application specific integrated circuit, an application specific integrated circuit place-and-route tool and/or other suitable tools may be used to generate a series of lithographic mask specifications for fabricating the circuit as a silicon chip. During step 220, analysis operations are performed using analysis tools to generate report data on various aspects of the implemented design such as timing performance, area consumed, resources consumed, power consumption, thermal profiles, noise levels, etc. Analysis results (report data) may be stored in report databases 22 (FIG. 2).

At step 222, the optimization assistance tool(s) may be run. The circuit designer may, for example, run the optimization assistance tool 32 by selecting an appropriate option from a menu of the type shown in FIG. 4. The optimization assistance tool uses information from databases 14 in analyzing the implementation of the circuit designer's design that has been produced by the compiler and/or other tools 12. During the analyzes operations of step 222, the optimization assistance tool 32 may identify potential problems with the current implementation of the circuit design and can recommend potential solutions to these problems. Potential problems and recommendations for improvements may relate to any suitable aspects of the design. For example, the tool 32 may identify problematic computer aided design tool settings such as programmable logic device compiler settings (e.g., node constraints, register packing settings, etc.) and other computer aided design tool settings (e.g., settings related to the sizes and other attributes of transistors and other circuit components, settlings related to integrated circuit linewidths, settings that direct the computer aided design tools to perform compilation and simulation operations using particular modes (e.g., area optimization or timing optimization, etc.). Recommended improvements to these settings and information on which settings are expected to be satisfactory may also be identified.

At step 224, the results of the analysis performed by the optimization assistance tool 32 may be displayed for the circuit designer. The optimization assistance tool 32 may display screens containing selectable options related to particular problem areas. When a given potential problem area option has been selected, tool 32 may display a screen containing associated recommendations for overcoming the potential problem. Links to relevant online help may be provided. Options may also be displayed that correspond to various computer aided design tools that can be used for editing the settings associated with potential problems and their recommended solutions.

When the circuit designer selects an appropriate option, the optimization assistance tool 32 launches the associated computer aided design tool (step 226). When launching the appropriate tool, the optimization assistance tool 32 may, if desired, direct the tool to display a particular menu, display screen, window, or other suitable portion of the tool's user interface so that the circuit designer need not search for that location in the launched tool. The optimization assistance tool 32 may also provide information to the launched tool on which design objects and other aspects of the implemented design have settings to be adjusted. By passing information on these parameters from the optimization assistance tool to the launched computer aided design tool, the circuit designer need not manually reenter this information unless desired.

Online help may be provided to the circuit designer if the circuit designer clicks on a online help link.

After the appropriate computer aided design tool has been launched, the circuit designer may decide whether to follow the recommendations provided by the optimization assistance tool and can use the computer aided design tool to make appropriate adjustments to appropriate computer aided design tool settings. These settings adjustments can be made to further restrict design constraints, to ease design constraints, or to modify the circuit design. As illustrated schematically by line 228, the overall process of inputting constraints, compiling the design, and using the optimization assistance tool to help a circuit designer overcome potential problems may be repeated in an iterative fashion until the circuit designer is satisfied that a suitable implementation of the design has been obtained.

The foregoing is merely illustrative of the principles of this invention and various modifications can be made by those skilled in the art without departing from the scope and spirit of the invention.

What is claimed is:

1. A method for providing assistance to a circuit designer, comprising:
    with computing equipment, receiving design data and constraint data for a circuit design and producing a corresponding output on a given implementation of the circuit design in an integrated circuit;
    with the computing equipment, processing the output and the constraint data to identify a potential problem with resource consumption by the given implementation of the circuit design in the integrated circuit; and
    with the computing equipment, recommending a plurality of potential solutions to the potential problem, wherein each of the potential solutions is individually selectable by the circuit designer, and wherein the potential solutions are selected from the group consisting of: use register packing, modify synthesis options, use time domain multiplexing, and use a larger integrated circuit.

2. The method defined in claim 1 further comprising:
    with the computing equipment, presenting at least one selectable option to the circuit designer that allows the circuit designer to automatically modify the constraint data to address the potential problem.

3. The method defined in claim 1 further comprising:
    when the circuit designer selects a given one of the potential solutions, automatically directing the computing equipment to display a given portion of a computer-aided design tool user interface for the circuit designer to use in implementing the selected potential solution.

4. The method defined in claim 1 further comprising:
    with the computing equipment, processing the output and the constraint data to identify multiple potential problems with the given implementation of the circuit design in the integrated circuit.

5. The method defined in claim 4 further comprising:
    with the computing equipment, recommending multiple potential solutions to the multiple potential problems, wherein each of the potential solutions is individually selectable by the circuit designer; and
    when the circuit designer selects a given one of the potential solutions, automatically directing the computing equipment to display a given portion of a computer-aided design tool user interface for the circuit designer to use in implementing the selected potential solution.

6. A method for providing assistance to a circuit designer, comprising:
    with computing equipment, receiving design data and constraint data for a circuit design and producing a corresponding output on a given implementation of the circuit design in an integrated circuit;
    with the computing equipment, processing the output and the constraint data to identify a potential problem with the given implementation of the circuit design;
    with the computing equipment, recommending a plurality of potential solutions to the potential problem, wherein each of the potential solutions is individually selectable by the circuit designer;
    with the computing equipment, processing the output and the constraint data to identify multiple potential problems with the given implementation of the circuit design in the integrated circuit, wherein the multiple potential problems are selected from the group consisting of: logic element usage, memory block usage, digital signal processor block usage, input/output usage, and routing resource usage.

7. The method defined in claim 6 further comprising:
    with the computing equipment, recommending multiple potential solutions to the multiple potential problems, wherein each of the potential solutions is individually selectable by the circuit designer, and wherein the multiple potential solutions are selected from the group consisting of: use register packing, modify synthesis options, modify synthesis options, use time domain multiplexing, and use a larger integrated circuit.

8. The method defined in claim 6 further comprising:
    with the computing equipment, recommending multiple potential solutions to the multiple potential problems, wherein each of the potential solutions is individually selectable by the circuit designer; and
    when the circuit designer selects a given one of the multiple potential solutions, automatically directing the computing equipment to display a given portion of a computer-aided design tool user interface for the circuit designer to use in implementing the selected potential solution.

9. The method defined in claim 6 further comprising:
    when the circuit designer selects a given one of the potential solutions, automatically directing the computing equipment to display a given portion of a computer-aided design tool user interface for the circuit designer to use in implementing the selected potential solution.

10. A method for providing assistance to a circuit designer, comprising:
    with computing equipment, receiving design data and constraint data for a circuit design and producing a corresponding output on a given implementation of the circuit design in an integrated circuit;
    with the computing equipment, processing the output and the constraint data to identify a potential problem with the given implementation of the circuit design;
    with the computing equipment, recommending a plurality of potential solutions to the potential problem, wherein each of the potential solutions is individually selectable by the circuit designer, wherein the potential solutions are displayed on a screen in an order that takes into account how important the recommended changes are and how difficult it is to make the recommended changes; and
    when the circuit designer selects a given one of the potential solutions, automatically launching a computer-aided design tool to be used by the logic designer in implementing the selected potential solution.

11. The method defined in claim 10 wherein automatically launching the computer-aided design tool comprises automatically providing the computer-aided design tool with information on which design objects are associated with the selected potential solution.

12. The method defined in claim 10 wherein automatically launching the computer-aided design tool comprises automatically providing the computer-aided design tool with information on which design objects and which aspects of the given implementation of the circuit design have settings that can be adjusted with the selected potential solution.

13. A method for providing assistance to a circuit designer, comprising:

with computing equipment, receiving design data and constraint data for a circuit design and producing a corresponding output on a given implementation of the circuit design in an integrated circuit; and with the computing equipment, processing the output and the constraint data to identify a potential problem with resource consumption by the given implementation of the circuit design in the integrated circuit, wherein the potential problem comprises a potential problem selected from the group consisting of: logic element usage, memory block usage, digital signal processor block usage, input/output usage, and routing resource usage.

* * * * *